(12) United States Patent
Wada

(10) Patent No.: US 11,873,577 B2
(45) Date of Patent: Jan. 16, 2024

(54) EPITAXIAL WAFER PRODUCTION SYSTEM FOR PERFORMING A CORRECTION BASED ON VARIATION IN TOTAL OUTPUT VALUE OF UPPER AND LOWER LAMPS

(71) Applicant: SUMCO CORPORATION, Tokyo (JP)

(72) Inventor: Naoyuki Wada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 342 days.

(21) Appl. No.: 17/220,337

(22) Filed: Apr. 1, 2021

(65) Prior Publication Data

US 2021/0324536 A1 Oct. 21, 2021

(30) Foreign Application Priority Data

Apr. 20, 2020 (JP) .................................. 2020-074964

(51) Int. Cl.
*C30B 25/16* (2006.01)
*C23C 16/46* (2006.01)
*C23C 16/52* (2006.01)
*C30B 25/10* (2006.01)
*C30B 35/00* (2006.01)

(52) U.S. Cl.
CPC ............ *C30B 25/165* (2013.01); *C23C 16/46* (2013.01); *C23C 16/52* (2013.01); *C30B 25/10* (2013.01); *C30B 25/16* (2013.01); *C30B 35/00* (2013.01)

(58) Field of Classification Search
CPC combination set(s) only.
See application file for complete search history.

(56) References Cited

U.S. PATENT DOCUMENTS

| 4,772,485 | A | * | 9/1988 | Ebata | ..................... | C23C 16/54 |
| | | | | | | 427/9 |
| 5,244,500 | A | * | 9/1993 | Ebata | ..................... | C23C 16/52 |
| | | | | | | 118/704 |
| 5,956,148 | A | * | 9/1999 | Celii | .................. | G01B 11/0641 |
| | | | | | | 356/369 |
| 6,071,349 | A | * | 6/2000 | Kurosawa | ............. | C23C 16/455 |
| | | | | | | 118/715 |
| 6,123,765 | A | * | 9/2000 | Sinha | ..................... | C30B 25/14 |
| | | | | | | 261/126 |
| 6,679,946 | B1 | * | 1/2004 | Jackson | .................. | C30B 25/16 |
| | | | | | | 117/85 |
| 6,726,767 | B1 | * | 4/2004 | Marrs | ..................... | C23C 16/52 |
| | | | | | | 117/85 |
| 7,751,921 | B2 | * | 7/2010 | Sakamoto | ........... | C23C 16/4412 |
| | | | | | | 702/182 |

(Continued)

FOREIGN PATENT DOCUMENTS

WO 2011/033752 A1 3/2011

*Primary Examiner* — Karl Kurple
(74) *Attorney, Agent, or Firm* — GREENBLUM & BERNSTEIN, P.L.C.

(57) ABSTRACT

For correction of a source gas supply time and a dopant gas flow rate, a calculation unit in an epitaxial wafer production system performs not only correction based on a result of comparing measured thickness and resistivity of an epitaxial film respectively with a target thickness range and a target resistivity range, but also correction based on a variation in total output value of upper and lower lamps.

5 Claims, 3 Drawing Sheets

(56) References Cited

U.S. PATENT DOCUMENTS

| | | | | |
|---|---|---|---|---|
| 2004/0087042 A1* | 5/2004 | Ghyselen | ............... | H01L 22/20 257/E21.525 |
| 2006/0054088 A1* | 3/2006 | Jagawa | ............... | C23C 16/455 438/5 |
| 2007/0062439 A1* | 3/2007 | Wada | ............... | C30B 25/16 117/89 |
| 2012/0118225 A1* | 5/2012 | Hsu | ............... | H01L 21/67248 118/667 |
| 2012/0174859 A1* | 7/2012 | Sakamoto | ............... | C30B 25/12 117/88 |
| 2012/0272892 A1* | 11/2012 | Paranjpe | ............... | C30B 25/14 118/724 |
| 2012/0285382 A1* | 11/2012 | Shimizu | ............... | C23C 16/4584 118/728 |
| 2013/0144419 A1* | 6/2013 | Tsai | ............... | H01L 22/20 700/121 |
| 2015/0128860 A1* | 5/2015 | Canizares | ............... | C23C 16/52 118/712 |
| 2016/0340800 A1* | 11/2016 | Ito | ............... | C30B 29/403 |
| 2020/0081423 A1* | 3/2020 | Clark | ............... | H01L 21/67023 |
| 2022/0259729 A1* | 8/2022 | Kang | ............... | C23C 16/52 |
| 2022/0319935 A1* | 10/2022 | Tetsuyama | ............... | C23C 16/52 |
| 2022/0406599 A1* | 12/2022 | Wada | ............... | C23C 16/4412 702/182 |

* cited by examiner

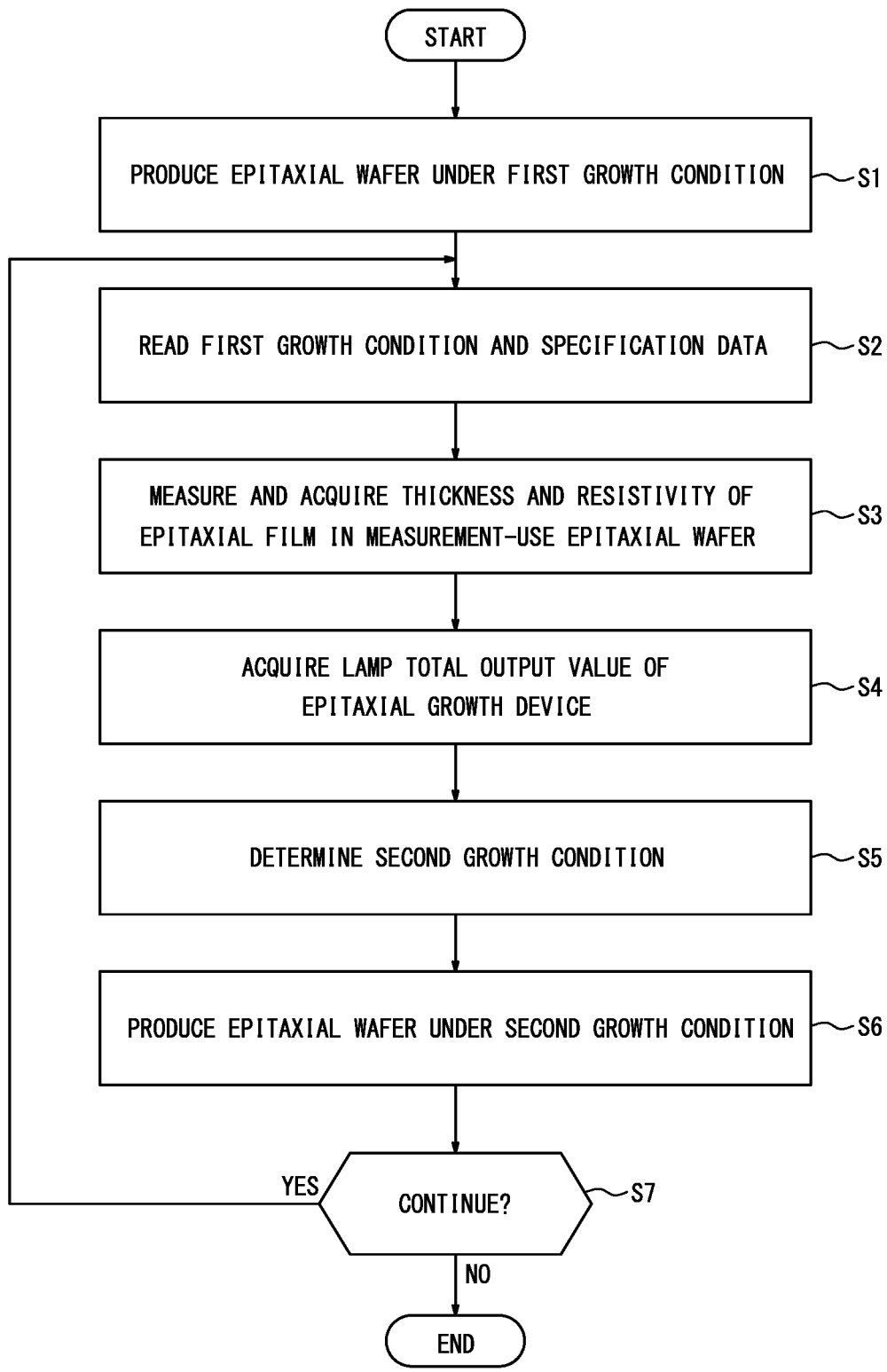

EPITAXIAL WAFER PRODUCTION SYSTEM FOR PERFORMING A CORRECTION BASED ON VARIATION IN TOTAL OUTPUT VALUE OF UPPER AND LOWER LAMPS

CROSS REFERENCE TO RELATED APPLICATION

This application claims priority to Japanese Patent Application No. 2020-74964 filed on Apr. 20, 2020, the entire disclosure of which is incorporated herein by reference.

TECHNICAL FIELD

The present disclosure relates to an epitaxial wafer production system including a single-wafer-processing epitaxial growth device that grows an epitaxial film on a front surface of a wafer to produce an epitaxial wafer, and an epitaxial wafer production method using the production system.

BACKGROUND

In the field of semiconductor electronics which are increasingly enhanced in performance or function, the quality of epitaxial wafers significantly influences the quality of product devices. An epitaxial wafer is formed by vapor phase growing an epitaxial film on a front surface of a semiconductor wafer. In accordance with regular atomic arrangement at the front surface of the semiconductor wafer, a high-quality epitaxial film with an aligned crystal axis is formed.

For epitaxial wafer production, a batch-processing epitaxial growth device capable of simultaneously performing epitaxial growth on a plurality of semiconductor wafers is conventionally used. However, the batch-processing epitaxial growth device has difficulty in responding to an increase in the diameter of semiconductor wafers. Hence, a single-wafer-processing epitaxial growth device that performs epitaxial growth individually on a single semiconductor wafer, as described in WO 2011/033752 A1 (PTL 1), is commonly used in recent years.

In epitaxial wafer production by the single-wafer-processing epitaxial growth device, the thickness of an epitaxial film is typically controlled by adjusting the supply time of a source gas (epitaxial growth time) in a state in which the concentration and flow rate of the source gas are controlled to be as constant as possible. The resistivity of the epitaxial film is typically controlled by adjusting the flow rate of a dopant gas in a state in which the concentration of the dopant gas is controlled to be as constant as possible.

CITATION LIST

Patent Literature

PTL 1: WO 2011/033752 A1

SUMMARY

An epitaxial wafer production system according to one of the disclosed embodiments comprises: a single-wafer-processing epitaxial growth device configured to form an epitaxial film on a front surface of a wafer to produce an epitaxial wafer; a thickness measurement device; a resistivity measurement device; a storage unit; and a calculation unit. The single-wafer-processing epitaxial growth device includes: a chamber; a susceptor located inside the chamber and configured to have the wafer placed thereon; a gas supply port provided in the chamber and configured to supply a source gas and a dopant gas into the chamber; an upper lamp and a lower lamp located respectively above and below the chamber, and configured to heat the wafer on the susceptor; an upper pyrometer and a lower pyrometer located respectively above and below the chamber, and configured to detect respectively a temperature of the front surface of the wafer and a temperature of a back surface of the susceptor; a source gas adjustment unit configured to adjust a supply time of supplying the source gas into the chamber via the gas supply port; a dopant gas adjustment unit configured to adjust a flow rate of flowing the dopant gas into the chamber via the gas supply port; and a control unit configured to perform lamp output control of controlling output values of the upper lamp and the lower lamp based on the temperature detected by the upper pyrometer or the lower pyrometer and outputting a total output value of the upper lamp and the lower lamp to the storage unit, and control of the source gas adjustment unit and the dopant gas adjustment unit. The thickness measurement device and the resistivity measurement device are configured to measure respectively a thickness and a resistivity of the epitaxial film in the epitaxial wafer produced by the single-wafer-processing epitaxial growth device, and thereafter output respectively the measured thickness and the measured resistivity to the storage unit. The storage unit is configured to store: a preset source gas supply time and a preset dopant gas flow rate applied to the single-wafer-processing epitaxial growth device; a target thickness range and a target resistivity range as specification data; the measured thickness output from the thickness measurement device and the measured resistivity output from the resistivity measurement device; and the total output value of the upper lamp and the lower lamp output from the control unit. The calculation unit is configured to correct the preset source gas supply time and the preset dopant gas flow rate to determine a corrected source gas supply time and a corrected dopant gas flow rate and output the corrected source gas supply time and the corrected dopant gas flow rate to the control unit and the storage unit, based on the preset source gas supply time and the preset dopant gas flow rate, the target thickness range and the target resistivity range, the measured thickness and the measured resistivity, and the total output value of the upper lamp and the lower lamp read from the storage unit. The control unit is configured to control the source gas adjustment unit and the dopant gas adjustment unit to achieve the corrected source gas supply time and the corrected dopant gas flow rate determined by the calculation unit.

An epitaxial wafer production method according to one of the disclosed embodiments is an epitaxial wafer production method of sequentially producing a plurality of epitaxial wafers using the foregoing epitaxial wafer production system.

BRIEF DESCRIPTION OF THE DRAWINGS

In the accompanying drawings:

FIG. 3 is a flowchart illustrating steps in an epitaxial wafer production method according to one of the disclosed embodiments.

DETAILED DESCRIPTION

Figure 1:
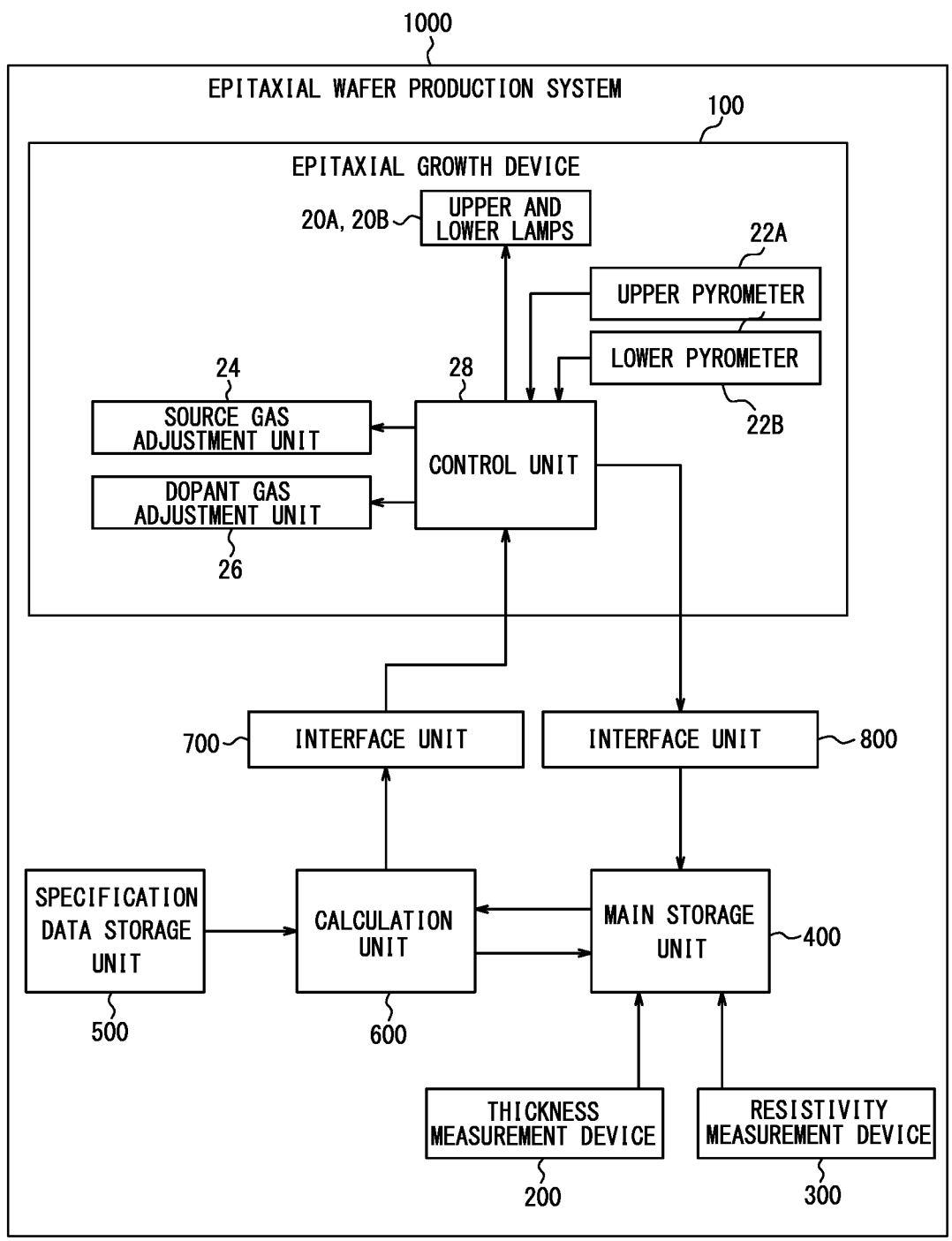
FIG. 1 is a block diagram illustrating a structure of an epitaxial wafer production system (1000) according to one of the disclosed embodiments.

In an epitaxial wafer as a product (hereafter referred to as "product-use epitaxial wafer"), the thickness and resistivity of an epitaxial film need to be respectively within a target thickness range and a target resistivity range defined in specifications. To produce an epitaxial wafer that conforms to the specifications, typically the source gas supply time and the dopant gas flow rate are determined by the following method: First, an epitaxial film is grown on a wafer not as a product (hereafter referred to as "monitor wafer") under the condition of a predetermined source gas supply time and dopant gas flow rate, to produce a measurement-use epitaxial wafer. The thickness and resistivity of the formed measurement-use epitaxial film are then measured. Based on the result of comparing the measured thickness and resistivity with the target thickness range and the target resistivity range (specification data) defined in the specifications, the source gas supply time and the dopant gas flow rate can be determined.

For example, suppose the target thickness range is 3.90 µm to 4.10 µm (specification center: 4.00 µm). Also suppose the concentration and flow rate of the source gas are controlled to be constant, and the thickness of the epitaxial film grown on the monitor wafer with a source gas supply time t1 is 4.02 µm. In this case, the thickness of the epitaxial film formed is 0.5% greater than the specification center. By setting a source gas supply time t2 in the subsequent product-use epitaxial wafer production to be 0.5% shorter than t1, that is, by setting t2=t1×0.995, the thickness of the epitaxial film can be brought closer to the specification center.

Likewise, suppose the target resistivity range is 9.0 Ω·cm to 11.0 Ω·cm (specification center: 10.0 Ω·cm). Also suppose the concentration of the dopant gas is controlled to be constant, and the resistivity of the epitaxial film grown on the monitor wafer with a dopant flow rate D1 is 10.1 Ω·cm. In this case, the resistivity of the epitaxial film formed is 1% higher than the specification center. By setting a dopant flow rate D2 in the subsequent product-use epitaxial wafer production to be 1% higher than D1, that is, by setting D2=D1×1.01, the resistivity of the epitaxial film can be brought closer to the specification center.

In view of this, there is a method (hereafter referred to as "comparative example method") whereby, each time a given number of (e.g. 200) product-use epitaxial wafers are produced, an epitaxial film is grown on a monitor wafer to produce a measurement-use epitaxial wafer, and the source gas supply time and the dopant gas flow rate used in the next production of the given number of (e.g. 200) product-use epitaxial wafers are determined based on the result of measuring the thickness and resistivity of the measurement-use epitaxial film. With the comparative example method by which the source gas supply time and the dopant gas flow rate in the subsequent production of product-use epitaxial wafers are determined based on the result of measuring the thickness and resistivity of the epitaxial film grown on the monitor wafer, an epitaxial wafer having an epitaxial film whose thickness and resistivity are close to the respective specification centers can be produced.

However, we found out that, in the case of continuously producing a large number of epitaxial wafers using the same epitaxial growth device in the comparative example method, the deviations of the thickness and resistivity of the epitaxial film from the respective specification centers cannot be reduced sufficiently. In particular, as the number of epitaxial wafers produced using the same epitaxial growth device increases, the deviations of the thickness and resistivity of the epitaxial film from the respective specification centers increase gradually.

In the comparative example method, one or more workers: (i) measure the thickness and resistivity of the epitaxial film grown on the monitor wafer; (ii) determine the subsequent source gas supply time and dopant gas flow rate based on the measurement result; and (iii) set the determined source gas supply time and dopant gas flow rate in the epitaxial growth device. In other words, with the comparative example method, the source gas supply time and the dopant gas flow rate cannot be determined automatically. There is thus no conventional production system for automatically applying a method for determining (correcting) the source gas supply time and the dopant gas flow rate to the epitaxial growth device.

It could therefore be helpful to provide an epitaxial wafer production system and production method capable of controlling the source gas supply time and the dopant gas flow rate with high accuracy to thus reduce the deviations of the thickness and resistivity of the epitaxial film from the respective specification centers.

We conducted intensive study to solve the problems stated above. In detail, we investigated the reason why, with the comparative example method, the deviations of the thickness and resistivity of the epitaxial film from the respective specification centers increase gradually as the number of epitaxial wafers produced using the same epitaxial growth device increases, and presumed the cause to be a phenomenon (hereafter referred to as "wall deposition") that a polysilicon film gradually deposits on the chamber inner wall of the epitaxial growth device. As wall deposition progresses, heat from a lamp located outside the chamber is less easily transferred to the wafer inside the chamber. This causes the wafer to be heated less easily. As a result, the epitaxial growth speed tends to be low. In such a case, the thickness of the epitaxial film formed with the same source gas supply time gradually decreases as the production quantity increases. In addition, as the epitaxial growth speed decreases, the amount of the dopant incorporated into the epitaxial film per unit time increases. Consequently, the resistivity of the epitaxial film formed with the same dopant flow rate gradually decreases as the production quantity increases. The comparative example method fails to timely reflect the influence of the decrease of the epitaxial growth speed caused by the progress of wall deposition, as a result of which the deviations of the thickness and resistivity of the epitaxial film from the respective specification centers increase.

We studied a method of correcting the source gas supply time and the dopant gas flow rate by which the influence of the decrease of the epitaxial growth speed caused by the progress of wall deposition can be reflected timely. As a result, we learned that the progress of wall deposition correlates with the variation in lamp output value. We also learned that the lamp output tends to decrease as wall deposition progresses (the detailed mechanism will be described later). We thus discovered the following: By performing, for the correction of the source gas supply time and the dopant gas flow rate, not only correction based on the result of comparing the measured thickness and resistivity of the epitaxial film respectively with the target thickness range and the target resistivity range as in the comparative example method but also correction based on the variation in lamp output value, the deviations of the thickness and resistivity of the epitaxial film from the respective specification centers can be reduced. We then developed a system capable of automatically determining (correcting) the source gas supply time and the dopant gas flow rate.

The present disclosure is based on these discoveries. We thus provide:

[1] An epitaxial wafer production system (1000) comprising: a single-wafer-processing epitaxial growth device (100) configured to form an epitaxial film on a front surface of a wafer (W) to produce an epitaxial wafer; a thickness measurement device (200); a resistivity measurement device (300); a storage unit (400, 500); and a calculation unit (600), wherein the single-wafer-processing epitaxial growth device (100) includes: a chamber (10); a susceptor (12) located inside the chamber (10) and configured to have the wafer (W) placed thereon; a gas supply port (16) provided in the chamber (10) and configured to supply a source gas and a dopant gas into the chamber (10); an upper lamp (20A) and a lower lamp (20B) located respectively above and below the chamber (10), and configured to heat the wafer (W) on the susceptor (12); an upper pyrometer (22A) and a lower pyrometer (22B) located respectively above and below the chamber (10), and configured to detect respectively a temperature of the front surface of the wafer (W) and a temperature of a back surface of the susceptor (12); a source gas adjustment unit (24) configured to adjust a supply time of supplying the source gas into the chamber (10) via the gas supply port (16); a dopant gas adjustment unit (26) configured to adjust a flow rate of flowing the dopant gas into the chamber (10) via the gas supply port (16); and a control unit (28) configured to perform lamp output control of controlling output values of the upper lamp (20A) and the lower lamp (20B) based on the temperature detected by the upper pyrometer (22A) or the lower pyrometer (22B) and outputting a total output value of the upper lamp (20A) and the lower lamp (20B) to the storage unit (400), and control of the source gas adjustment unit (24) and the dopant gas adjustment unit (26), wherein the thickness measurement device (200) and the resistivity measurement device (300) are configured to measure respectively a thickness and a resistivity of the epitaxial film in the epitaxial wafer produced by the single-wafer-processing epitaxial growth device (100), and thereafter output respectively the measured thickness and the measured resistivity to the storage unit (400), the storage unit (400, 500) is configured to store: a preset source gas supply time and a preset dopant gas flow rate applied to the single-wafer-processing epitaxial growth device (100); a target thickness range and a target resistivity range as specification data; the measured thickness output from the thickness measurement device (200) and the measured resistivity output from the resistivity measurement device (300); and the total output value of the upper lamp (20A) and the lower lamp (20B) output from the control unit (28), the calculation unit (600) is configured to correct the preset source gas supply time and the preset dopant gas flow rate to determine a corrected source gas supply time and a corrected dopant gas flow rate and output the corrected source gas supply time and the corrected dopant gas flow rate to the control unit (28) and the storage unit (400), based on the preset source gas supply time and the preset dopant gas flow rate, the target thickness range and the target resistivity range, the measured thickness and the measured resistivity, and the total output value of the upper lamp (20A) and the lower lamp (20B) read from the storage unit (400, 500), and the control unit (28) is configured to control the source gas adjustment unit (24) and the dopant gas adjustment unit (26) to achieve the corrected source gas supply time and the corrected dopant gas flow rate determined by the calculation unit (600).

[2] The epitaxial wafer production system (1000) according to [1], wherein the calculation unit (600) is configured to, in the case where the total output value of the upper lamp (20A) and the lower lamp (20B) read from the storage unit (400) decreases, correct the preset source gas supply time to be longer to determine the corrected source gas supply time.

[3] The epitaxial wafer production system (1000) according to [1] or [2], wherein the calculation unit (600) is configured to, in the case where the total output value of the upper lamp (20A) and the lower lamp (20B) read from the storage unit (400) decreases, correct the preset dopant gas flow rate to be lower to determine the corrected dopant gas flow rate.

[4] An epitaxial wafer production method of sequentially producing a plurality of epitaxial wafers using the epitaxial wafer production system (1000) according to any one of [1] to [3].

With the epitaxial wafer production system and production method according to the present disclosure, the source gas supply time and the dopant gas flow rate can be controlled with high accuracy, and the deviations of the thickness and resistivity of the epitaxial film from the respective specification centers can be reduced.

[Epitaxial Wafer Production System]

An epitaxial wafer production system (1000) according to one of the disclosed embodiments includes a single-wafer-processing epitaxial growth device (100), a thickness measurement device (200), a resistivity measurement device (300), a main storage unit (400), a specification data storage unit (500), and a calculation unit (600), as illustrated in FIG. 1. Each component will be described in detail below.

(Single-Wafer-Processing Epitaxial Growth Device)

Figure 2:
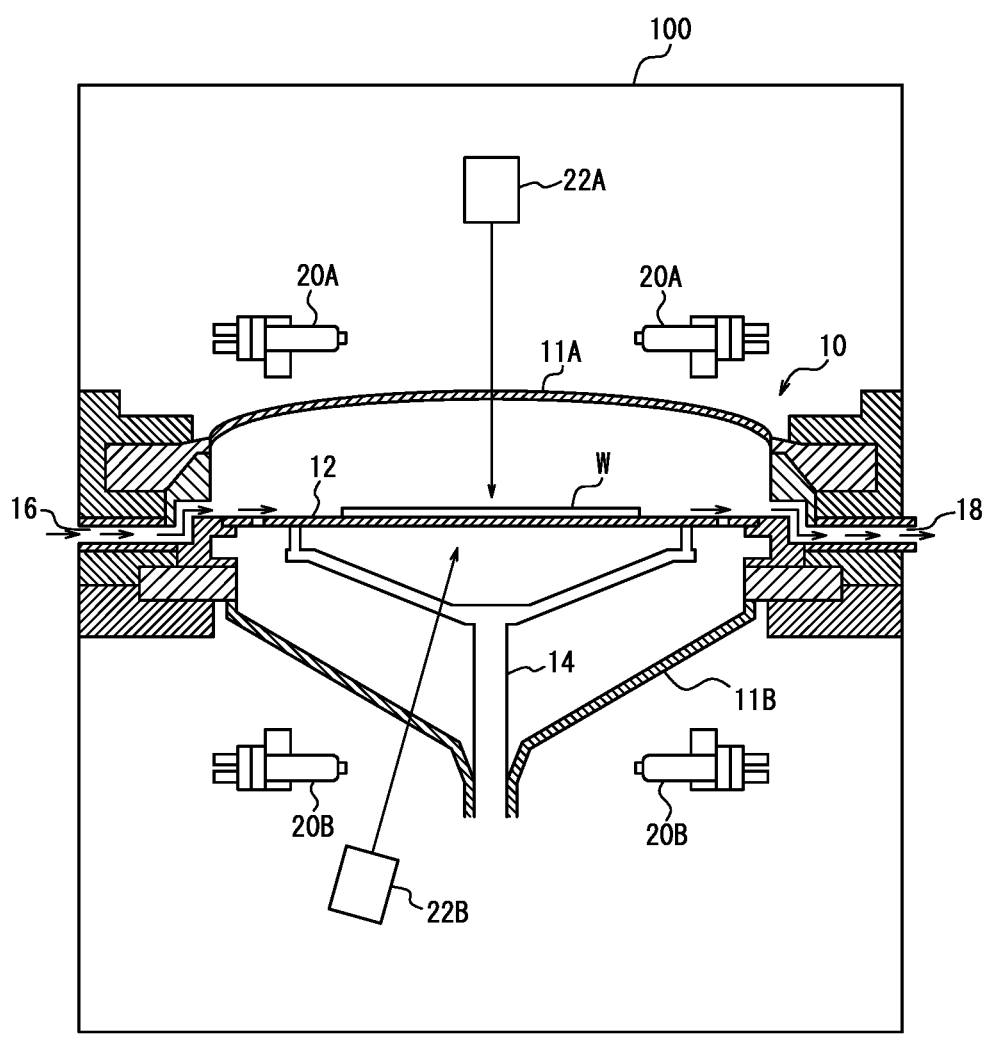
FIG. 2 is a schematic sectional diagram of a single-wafer-processing epitaxial growth device (100) included in the epitaxial wafer production system (1000) according to one of the disclosed embodiments.

The single-wafer-processing epitaxial growth device (100) includes a chamber (10), a susceptor (12), a susceptor support shaft (14), a gas supply port (16), a gas exhaust port (18), an upper lamp (20A), a lower lamp (20B), an upper pyrometer (22A), and a lower pyrometer (22B), as illustrated in FIG. 2. The single-wafer-processing epitaxial growth device (100) further includes a source gas adjustment unit (24), a dopant gas adjustment unit (26), and a control unit (28) as components illustrated in the block diagram in FIG. 1. Each component will be described below.

The chamber (10) includes an upper dome (11A), a lower dome (11B), and a dome mounting body for mounting the upper dome (11A) and the lower dome (11B). The chamber (10) defines an epitaxial film forming chamber. The upper dome (11A) and the lower dome (11B) may be made of quartz. Quartz has excellent heat resistance, and easily transmits infrared light emitted from an infrared lamp. As a result, the wafer (W) can be heated uniformly.

The susceptor (12) is a disk-shaped member located inside the chamber (10) and used to have the wafer (W) placed thereon. The susceptor (12) may be formed by coating the surface of a base material that is carbon graphite (black lead) with silicon carbide. A spot facing part (not illustrated) for placing and storing the wafer is formed on the front surface of the susceptor (12).

The susceptor support shaft (14) supports the susceptor (12) from below, in the chamber (10). A main pillar of the susceptor support shaft (14) is approximately coaxial with the center of the susceptor (12). The susceptor support shaft (14) may be made of quartz, and particularly made of synthetic quartz.

At least one gas supply port (16) is provided in the chamber (10). A source gas, a carrier gas, and a dopant gas are supplied into the chamber (10) via the gas supply port (16). Examples of the source gas that can be used include trichlorosilane ($SiHCl_3$) gas and dichlorosilane ($SiH_2Cl_2$) gas. Examples of the carrier gas that can be used include hydrogen ($H_2$). Examples of the dopant gas that can be used include diborane ($B_2H_6$) and phosphine ($PH_3$). At least one gas exhaust port (18) is provided in the chamber (10). The gas inside the chamber (10) is exhausted via the gas exhaust port (18).

The upper lamp (20A) and the lower lamp (20B) are located respectively above and below the chamber (10), and heat the wafer (W) on the susceptor (12). As each of the upper lamp (20A) and the lower lamp (20B), a halogen lamp or an infrared lamp having a high temperature increase/decrease speed and excellent temperature controllability may be typically used.

The upper pyrometer (22A) is located above the chamber (10), and detects the temperature of the front surface of the wafer (W). The lower pyrometer (22B) is located below the chamber (10), and detects the temperature of the back surface of the susceptor (12).

The source gas adjustment unit (24) is configured to adjust the supply time (epitaxial growth time) of supplying the source gas into the chamber (10) via the gas supply port (16). Specifically, the source gas adjustment unit (24) may be composed of a mass flow controller. In each epitaxial growth operation, the mass flow controller as the source gas adjustment unit (24) supplies the source gas into the chamber (10) while controlling the flow rate of the source gas of a constant concentration to be constant. The mass flow controller as the source gas adjustment unit (24) controls the opening-closing operation of air operation valves installed before and after the mass flow controller so as to supply the source gas for the source gas supply time designated by the below-described control unit (28), as illustrated in FIG. 1.

The dopant gas adjustment unit (26) is configured to adjust the flow rate of flowing the dopant gas into the chamber (10) via the gas supply port (16). Specifically, the dopant gas adjustment unit (26) may be composed of a mass flow controller. In each epitaxial growth operation, the dopant gas adjustment unit (26) supplies the dopant gas of a constant concentration into the chamber (10). The mass flow controller as the dopant gas adjustment unit (26) controls the flow rate setting so as to supply the dopant gas at the dopant gas flow rate designated by the below-described control unit (28), as illustrated in FIG. 1.

The control unit (28) may include a central processing unit (CPU) provided in the epitaxial growth device (100). The control unit (28) controls the overall process of the epitaxial growth device (100). In particular, the control unit (28) performs: lamp output control of controlling the output values of the upper lamp (20A) and the lower lamp (20B) based on the temperature detected by the upper pyrometer (22A) or the lower pyrometer (22B) and outputting the total output value of the upper lamp (20A) and the lower lamp (20B) to the storage unit (400); and control of the source gas adjustment unit (24) and the dopant gas adjustment unit (26).

The lamp output control will be described below. As illustrated in FIG. 1, the control unit (28) controls the output values of the upper lamp (20A) and the lower lamp (20B) based on the temperature detected by the upper pyrometer (22A). Specifically, the control unit (28) performs proportional integral differential (PID) control on the output values of the upper lamp (20A) and the lower lamp (20B) so that the temperature detected by the upper pyrometer (22A) will be a predetermined value (e.g. 1130° C.). Alternatively, the control unit (28) may control the output values of the upper lamp (20A) and the lower lamp (20B) based on the temperature detected by the lower pyrometer (22B). Specifically, the control unit (28) performs PID control on the output values of the upper lamp (20A) and the lower lamp (20B) so that the temperature detected by the lower pyrometer (22B) will be a predetermined value (e.g. 1130° C.).

The control unit (28) then outputs the total output value of the upper lamp (20A) and the lower lamp (20B) controlled, to the below-described main storage unit (400) via an interface unit (800). That is, in the process of epitaxial growth, the total output value of the upper lamp (20A) and the lower lamp (20B) is constantly read and stored in the main storage unit (400) as temporal data.

The control of the source gas adjustment unit (24) and the dopant gas adjustment unit (26) will be described below. The control unit (28) controls the source gas adjustment unit (24) and the dopant gas adjustment unit (26) so as to achieve the source gas supply time and the dopant gas flow rate designated by the below-described calculation unit (600).

The single-wafer-processing epitaxial growth device (100) having the above-described structure forms an epitaxial film on the front surface of the wafer (W) to produce an epitaxial wafer. Specifically, after placing the wafer (W) on the susceptor (12), the single-wafer-processing epitaxial growth device (100) turns on the upper lamp (20A) and the lower lamp (20B) to heat the wafer (W). The single-wafer-processing epitaxial growth device (100) introduces the source gas, the carrier gas, and the dopant gas from the gas supply port (16), while simultaneously performing exhaust from the gas exhaust port (18). The source gas, the carrier gas, and the dopant gas then flow in a laminar flow state along the front surface of the wafer (W) heated to a predetermined temperature. Consequently, the epitaxial film grows on the wafer (W).

(Thickness Measurement Device)

With reference to FIG. 1, the thickness measurement device (200) measures the thickness of the epitaxial film in the epitaxial wafer produced by the single-wafer-processing epitaxial growth device (100). An example of the thickness measurement device (200) is a FT-IR film thickness measuring device such as QS-3300 series made by Nanometrics. Data of the measured thickness is output to and stored in the below-described main storage unit (400).

(Resistivity Measurement Device)

With reference to FIG. 1, the resistivity measurement device (300) measures the resistivity of the epitaxial film in the epitaxial wafer produced by the single-wafer-processing epitaxial growth device (100). An example of the resistivity measurement device (300) is a resistivity measurement device by CV method such as MCV-2200/2500 made by Semilab Inc. Data of the measured resistivity is output to and stored in the below-described main storage unit (400).

(Main Storage Unit)

With reference to FIG. 1, the main storage unit (400) may include an external storage device (data server) connected to the epitaxial growth device (100) via the interface unit (800). The main storage unit (400) stores the following information:

(i) the preset source gas supply time t1 and the preset dopant gas flow rate D1 applied to the single-wafer-processing epitaxial growth device (100);

(ii) the measured thickness output from the thickness measurement device (200) and the measured resistivity output from the resistivity measurement device (300); and (iii) the total output value of the upper lamp (20A) and the lower lamp (20B) output from the control unit (28).

(Specification Data Storage Unit)

With reference to FIG. 1, the specification data storage unit (500) may include a typical external storage device. The specification data storage unit (500) stores (iv) a target thickness range and a target resistivity range as specification data. For example, in the case where the target thickness range is 3.90 µm to 4.10 µm (specification center: 4.00 µm) and the target resistivity range is 9.0 Ω·cm to 11.0 Ω·cm (specification center: 10.0 Ω·cm), the specification data storage unit (500) stores these specification data.

In the structure illustrated in FIG. 1, the main storage unit (400) that stores the information (i), (ii), and (iii) and the specification data storage unit (500) that stores the information (iv) are implemented by separate external storage devices. The disclosed embodiments are, however, not limited to such, and the information (i) to (iv) may be stored in a single external storage device as a storage unit, or the information (i) to (iv) may each be stored in a different storage device.

(Calculation Unit)

The calculation unit (600) may include a central processing unit (CPU) provided in the epitaxial wafer production system (1000). The calculation unit (600) corrects the preset source gas supply time t1 and the preset dopant gas flow rate D1 to determine a corrected source gas supply time t2 and a corrected dopant gas flow rate D2, based on the information (i) to (iii) read from the main storage unit (400) and the information (iv) read from the specification data storage unit (500).

The calculation unit (600) outputs the determined corrected source gas supply time t2 and corrected dopant gas flow rate D2 to the control unit (28) via an interface unit (700). Having received the output, the control unit (28) controls the source gas adjustment unit (24) and the dopant gas adjustment unit (26) so as to achieve the determined corrected source gas supply time t2 and corrected dopant gas flow rate D2.

The calculation unit (600) also outputs the determined corrected source gas supply time t2 and corrected dopant gas flow rate D2 to the main storage unit (400), and stores t2 and D2 in the main storage unit (400) as a new preset source gas supply time and preset dopant gas flow rate, i.e. the information (i).

[Epitaxial Wafer Production Method]

With reference to FIGS. 1 and 3, an epitaxial wafer production method using the epitaxial wafer production system (1000) will be described below.

(Step S1)

In step S1, an epitaxial wafer is produced under a first epitaxial growth condition (the preset source gas supply time t1 and the preset dopant gas flow rate D1). Specifically, the calculation unit (600) reads the information of the preset source gas supply time t1 and the preset dopant gas flow rate D1 from the main storage unit (400), and outputs the information to the control unit (28) via the interface unit (700). The control unit (28) controls the source gas adjustment unit (24) and the dopant gas adjustment unit (26) to achieve t1 and D1.

The method of determining t1 and D1 is not limited. For example, t1 and D1 may be determined by growing an epitaxial film on a monitor wafer under the condition of a predetermined source gas supply time t0 and dopant gas flow rate D0 and then measuring the thickness and resistivity of the epitaxial film and comparing the measured thickness and resistivity with the specification center thickness and resistivity.

For example, suppose the target thickness range is 3.90 µm to 4.10 µm (specification center: 4.00 µm). Also suppose the concentration and flow rate of the source gas are controlled to be constant, and the thickness of the epitaxial film grown on the monitor wafer with the source gas supply time t0 is 4.02 µm. In this case, the thickness of the epitaxial film formed is 0.5% greater than the specification center. Hence, the source gas supply time t1 can be set to be 0.5% shorter than t0, that is, t1=t0×0.995.

Likewise, suppose the target resistivity range is 9.0 Ω·cm to 11.0 Ω·cm (specification center: 10.0 Ω·cm). Also suppose the concentration of the dopant gas is controlled to be constant, and the resistivity of the epitaxial film grown on the monitor wafer with the dopant flow rate D0 is 10.1 Ω·cm. In this case, the resistivity of the epitaxial film formed is 1% higher than the specification center. Hence, the dopant flow rate D1 can be set to be 1% higher than D0, that is, D1=D0×1.01.

In step S1, a plurality of (e.g. 25/lot×8 lots=200) product-use epitaxial wafers may be produced. After this, a measurement-use epitaxial wafer using one monitor wafer may be produced.

In the process of each epitaxial growth operation, the total output value of the upper lamp (20A) and the lower lamp (20B) is constantly read and stored in the main storage unit (400) as temporal data, as mentioned earlier.

(Step S2)

In step S2, the calculation unit (600) reads the first epitaxial growth condition (the preset source gas supply time t1 and dopant gas flow rate D1) from the main storage unit (400). The calculation unit (600) also reads the specification data such as the target thickness range of 3.90 µm to 4.10 µm (specification center tec: 4.00 µm) and the target resistivity range of 9.0 Ω·cm to 11.0 Ω·cm (specification center pec: 10.0 Ω·cm), from the specification data storage unit (500).

(Step S3)

In step S3, the thickness measurement device (200) measures the thickness of the epitaxial film in a measurement-use epitaxial wafer produced under the first epitaxial growth condition. Moreover, the resistivity measurement device (300) measures the resistivity of the epitaxial film in the measurement-use epitaxial wafer produced under the first epitaxial growth condition. The measured thickness te1 and the measured resistivity pe1 are stored in the main storage unit (400). As each of the measured thickness te1 and the measured resistivity pe1, an average value of measurement values at a plurality of points in the wafer plane may be used. For example, an average value of measurement values at a plurality of points (e.g. four to eight points) at the same distance (e.g. R/2) from the wafer center may be used as a measurement value, where R is the wafer radius.

The calculation unit (600) then acquires the measured thickness te1 and the measured resistivity pe1 of the epitaxial film from the main storage unit (400).

(Step S4)

In step S4, the calculation unit (600) reads the total output value of the upper lamp (20A) and the lower lamp (20B) from the main storage unit (400). In a plurality of epitaxial growth operations performed in step S1, the total output value of the upper lamp (20A) and the lower lamp (20B) is constantly read and stored in the main storage unit (400) as temporal data, as mentioned earlier. Accordingly, for example, the calculation unit (600) reads the average value of the total output values of the upper and lower lamps in all epitaxial growth operations. In this way, the calculation unit (600) can recognize the variation in the total output value of the upper and lower lamps in the process of producing a plurality of epitaxial wafers in step S1.

The order in which steps S2, S3, and S4 are performed is not limited.

(Step S5)

Following this, in step S5, the calculation unit (600) corrects the preset source gas supply time t1 and the preset dopant gas flow rate D1 to determine the corrected source gas supply time t2 and the corrected dopant gas flow rate D2, based on the information (i), (ii), and (iii) read from the main storage unit (400) and the information (iv) read from the specification data storage unit (500). As mentioned above, the information (i) indicates the preset source gas supply time t1 and the preset dopant gas flow rate D1 applied to the single-wafer-processing epitaxial growth device (100). The information (ii) indicates the measured thickness output from the thickness measurement device (200) and the measured resistivity output from the resistivity measurement device (300). The information (iii) indicates the total output value of the upper lamp (20A) and the lower lamp (20B) output from the control unit (28). The information (iv) indicates the target thickness range and the target resistivity range as the specification data.

A specific method of determining the corrected source gas supply time t2 and the corrected dopant gas flow rate D2 as a second epitaxial growth condition will be described below. The corrected source gas supply time t2 and the corrected dopant gas flow rate D2 can be calculated by respectively multiplying the preset source gas supply time t1 and the preset dopant gas flow rate D1 as the first epitaxial growth condition each by a predetermined correction coefficient determined as a result of the below-described first correction and second correction.

<First Correction>

The first correction is the same as the foregoing comparative method, and corresponds to comparing the measured thickness te1 and the measured resistivity pe1 in the measurement-use epitaxial wafer respectively with the specification center tec of target thickness and the specification center pec of target resistivity in the specification data.

In the case where the measured thickness te1 is greater than the specification center tec, the correction coefficient needs to be less than 1, in order to reduce the source gas supply time. In the case where the measured thickness te1 is less than the specification center tec, the correction coefficient needs to be greater than 1, in order to increase the source gas supply time. Therefore, for example, tec/te1 or {1+(tec−te1)/tec} may be used as a mathematical expression for calculating the correction coefficient.

In the case where the measured resistivity pe1 is greater than the specification center pec, the correction coefficient needs to be greater than 1, in order to increase the dopant gas flow rate. In the case where the measured resistivity pe1 is less than the specification center pec, the correction coefficient needs to be less than 1, in order to reduce the dopant gas flow rate. Therefore, for example, pe1/pec may be used as a mathematical expression for calculating the correction coefficient.

<Second Correction>

The second correction takes into account the total output value of the upper lamp (20A) and the lower lamp (20B) read from the main storage unit (400). In the process of producing a plurality of epitaxial wafers in step S1, wall deposition progresses gradually. As wall deposition progresses, heat from the upper lamp (20A) and the lower lamp (20B) located outside the chamber (10) is less easily transferred to the wafer (W) inside the chamber. This causes the wafer (W) to be heated less easily. As a result, the epitaxial growth speed tends to be low.

In such a case, the thickness of the epitaxial film formed with the same epitaxial time gradually decreases as the production quantity increases. This requires such correction that increases the source gas supply time as wall deposition progresses. In addition, as the epitaxial growth speed decreases, the amount of the dopant incorporated into the epitaxial film per unit time increases. Consequently, the resistivity of the epitaxial film formed with the same amount of the dopant gradually decreases as the production quantity increases. This requires such correction that reduces the dopant gas flow rate as wall deposition progresses.

The second correction can be performed as correction of the total output value of the upper lamp (20A) and the lower lamp (20B). This is because the total output value of the upper lamp (20A) and the lower lamp (20B) decreases with the progress of wall deposition due to the following mechanism: First, when wall deposition progresses, radiation from polysilicon adhering to the inner wall of the upper dome (11A) occurs. Due to the radiation from the polysilicon, the upper pyrometer (22A) detects a temperature higher than the actual temperature of the front surface of the wafer (W). The control unit (28) performs PID control in a direction in which the output values of the upper lamp (20A) and the lower lamp (20B) decrease so that the temperature detected by the upper pyrometer (22A) will approach a predetermined value (e.g. 1130° C.). This causes the wafer (W) to be heated less easily. Further, as wall deposition progresses, heat from the upper lamp (20A) and the lower lamp (20B) is less easily transferred to the wafer (W) inside the chamber, as mentioned above. This also causes the wafer (W) to be heated less easily. Thus, in the process of producing a plurality of epitaxial wafers in step S1, as the total output value of the upper and lower lamps decreases, wall deposition progresses and the epitaxial growth speed decreases. Wall deposition also occurs on the inner wall of the lower dome (11B) to some extent. Therefore, in the case of controlling the output values of the upper lamp (20A) and the lower lamp (20B) based on the temperature detected by the lower pyrometer (22B), the total output value of the upper and lower lamps can decrease, too.

In view of this, in this embodiment, in the case where the total output value of the upper lamp (20A) and the lower lamp (20B) read from the main storage unit (400) varies in a decreasing direction, the calculation unit (600) corrects the source gas supply time to be longer and corrects the dopant gas flow rate to be lower.

The method of determining the correction coefficient is not limited as long as the variation in the total output value of the upper and lower lamps is reflected. For example, the correction coefficient can be determined in the following manner: First, for 25 epitaxial wafers in the last lot (e.g. the eighth lot) produced in step S1, the average value of the total output values of the upper and lower lamps in the respective epitaxial growth operations is read from the main storage unit (400). Let W1 be the read average value. Moreover, for 25 epitaxial wafers in the lot (e.g. the seventh lot) immediately preceding the last lot produced in step S1, the average value of the total output values of the upper and lower lamps in the respective epitaxial growth operations is read from the main storage unit (400). Let W2 be the read average value. The correction coefficient may then be determined based on the decrease of W1 from W2. For example, in the case where W1 is 1% less than W2, the source gas supply time is corrected to increase by 1%, and the dopant gas flow rate is corrected to decrease by 1%. In other words, W2/W1 or {1+(W2−W1)/W2} can be used as a mathematical expression for calculating the correction coefficient for the source gas supply time, and W1/W2 can be used as a mathematical expression for calculating the correction coefficient for the dopant gas flow rate.

<Examples of Correction Formulas>

Specific examples of correction formulas are as follows.

For example, the correction formula for the epitaxial growth time may be $$t2=t1\times(tec/te1)\times(W2/W1),\text{ or}$$

$$t2=t1\times\{1+(tec-te1)/tec\}\times\{1+(W2-W1)/W2\},$$

where t1 is the preset source gas supply time, t2 is the corrected source gas supply time, tec is the specification center of the target thickness range, te1 is the measured thickness of the epitaxial film of the measurement-use epitaxial wafer, W1 is the average value of the total output values of the upper and lower lamps in the 25 epitaxial wafers of the last lot, and W2 is the average value of the total output values of the upper and lower lamps in the 25 epitaxial wafers of the lot immediately preceding the last lot.

For example, the correction formula for the dopant gas flow rate may be $$D2=D1\times(pe1/pec)\times(W1/W2),$$

where D1 is the preset dopant gas flow rate, D2 is the corrected dopant gas flow rate, pec is the specification center of the target resistivity range, pe1 is the measured resistivity of the epitaxial film of the measurement-use epitaxial wafer, W1 is the average value of the total output values of the upper and lower lamps in the 25 epitaxial wafers of the last lot, and W2 is the average value of the total output values of the upper and lower lamps in the 25 epitaxial wafers of the lot immediately preceding the last lot.

The calculation unit (600) outputs the second epitaxial growth condition (the corrected source gas supply time t2 and dopant gas flow rate D2) determined in the above-described manner, to the control unit (28) and the main storage unit (400).

(Step S6)

In step S6, the control unit (28) controls the source gas adjustment unit (24) and the dopant gas adjustment unit (26) to perform epitaxial wafer production under the second epitaxial growth condition newly determined by the calculation unit (600). In step S6, a plurality of (e.g. 25/lot×8 lots=200) product-use epitaxial wafers may be produced. After this, a measurement-use epitaxial wafer using one monitor wafer may be produced.

(Step S7)

In step S7, whether to continue epitaxial wafer production may be determined. In the case of continuing epitaxial wafer production (step S7: YES), the process may return to step S2, and the above-described epitaxial condition correction (steps S2 to S5) and epitaxial wafer production under the corrected epitaxial condition (step S6) may be repeatedly performed. In the case of repeatedly performing the process in steps S2 to S6, the number of times the process is performed may be counted. Let n be the number of times the process is performed. In this case, for example, the growth condition in step S2 performed the nth time is expressed as the nth growth condition, and the growth condition in step S5 or S6 performed the nth time is expressed as the (n+1)th growth condition. In detail, in step S5, the (n+1)th growth condition is determined based on the measurement result of the epitaxial wafer produced under the nth growth condition. In step S6, the epitaxial wafer is produced under the (n+1)th growth condition determined in step S5. In the case of not continuing epitaxial wafer production in step S7 (step S7: NO), that is, in the case of not repeating steps S2 to S6, the process by the epitaxial wafer production method in FIG. 3 ends.

With the above-described epitaxial wafer production system (1000) and epitaxial wafer production method using the production system (1000) according to one of the disclosed embodiments, by correcting the source gas supply time and the dopant gas flow rate based on the variation in lamp output value, the influence of the phenomenon relating to the epitaxial growth speed caused by the progress of wall deposition can be timely reflected in the epitaxial wafer production condition. Thus, the deviations of the thickness and resistivity of the epitaxial film from the respective specification centers can be reduced.

The above describes an example of correcting both the source gas supply time and the dopant gas flow rate to control both of the thickness and resistivity of the epitaxial film. The disclosed embodiments are, however, not limited to such, and one of the source gas supply time and the dopant gas flow rate may be corrected to control one of the thickness and resistivity of the epitaxial film.

EXAMPLES

Example

An example (disclosed example) of producing epitaxial silicon wafers by performing the processing flow illustrated in FIG. 3 by the epitaxial wafer production system illustrated in FIGS. 1 and 2 will be described below. As product-use wafers and monitor wafers, p-type monocrystalline silicon wafers of 300 mm in diameter and 10 Ω·cm in resistivity were used. The specifications for epitaxial films define a target thickness range of 3.90 μm to 4.10 μm (specification center: 4.00 μm) and a target resistivity range of 9.0 Ω·cm to 11.0 Ω·cm (specification center: 10.0 Ω·cm). In one epitaxial growth operation, hydrogen baking was performed at 1130° C. for 60 sec. Subsequently, a mixed reaction gas obtained by diluting $SiHCl_3$ as a silicon source and $B_2H_6$ as a boron dopant source with hydrogen gas was supplied into the chamber in the epitaxial growth device. The output values of the upper and lower lamps were then PID-controlled so that the temperature detected by the upper pyrometer would be 1130° C.

As the thickness measurement device, a FT-IR film thickness measuring device was used. As the resistivity measurement device, a resistivity measurement device by CV method was used.

In step S1, 200 product-use epitaxial wafers of 8 lots were produced. After this, one measurement-use epitaxial wafer was produced using a monitor wafer. Steps S2 to S5 were then performed to correct the source gas supply time and the dopant gas flow rate according to one of the disclosed embodiments. Subsequently, in step S6, 200 product-use epitaxial wafers of 8 lots were produced with the corrected source gas supply time and dopant gas flow rate. After this, one measurement-use epitaxial wafer was produced using a monitor wafer. In this example, steps S2 to S6 were repeatedly performed until 30 measurement-use epitaxial wafers produced. Here, the source gas supply time and the dopant gas flow rate were corrected based on the following correction formulas:

$t2 = t1 \times (tec/te1) \times (W2/W1)$ $D2 = D1 \times (pe1/pec) \times (W1/W2)$.

Comparative Example

In a comparative example, epitaxial silicon wafers were produced by the same method as the disclosed example, except that the correction based on the variation in lamp output value was not performed. In the comparative example, the source gas supply time and the dopant gas flow rate were corrected based on the following correction formulas:

$t2 = t1 \times (tec/te1)$ $D2 = D1 \times (pe1/pec)$.

In the method of the comparative example, one or more workers conducted all of: (i) measuring the thickness and resistivity of the epitaxial film grown on the monitor wafer; (ii) determining the subsequent source gas supply time and dopant gas flow rate based on the measurement result; and (iii) setting the determined source gas supply time and dopant gas flow rate in the epitaxial growth device.

[Evaluation of Cpk]

In the disclosed example and the comparative example, the thickness and resistivity of the epitaxial film in each of the 30 monitor wafers were measured. The deviation of the measurement value from the specification center was then evaluated using a process capability index Cpk. A larger Cpk value indicates a smaller deviation of the measurement value from the specification center. The measurement results of the disclosed example and the comparative example are shown in Table 1.

TABLE 1

| Category | Cpk | |
|---|---|---|
| | Thickness of epitaxial film | Resistivity of epitaxial film |
| Comparative Example | 1.02 | 0.98 |
| Disclosed Example | 1.78 | 1.77 |

As is clear from Table 1, Cpk of each of the thickness and resistivity of the epitaxial film produced according to the disclosed example was greater than Cpk of each of the thickness and resistivity of the epitaxial film produced according to the comparative example. In other words, the disclosed example reduced the deviations of the thickness and resistivity of the produced epitaxial film from the respective specification centers, as compared with the comparative example.

INDUSTRIAL APPLICABILITY

With the epitaxial wafer production system and production method according to the present disclosure, the source gas supply time and the dopant gas flow rate can be controlled with high accuracy. The deviations of the thickness and resistivity of the epitaxial film from the respective specification centers can thus be reduced.

The invention claimed is:

1. An epitaxial wafer production system comprising:
a single-wafer-processing epitaxial growth device configured to form an epitaxial film on a front surface of a wafer to produce an epitaxial wafer;
a thickness measurer;
a resistivity measurer;
a data server; and
a first central processing unit (CPU),
wherein the single-wafer-processing epitaxial growth device includes:
a chamber;
a susceptor located inside the chamber and configured to have the wafer placed thereon;
a gas supply port provided in the chamber and configured to supply a source gas and a dopant gas into the chamber;
an upper lamp and a lower lamp located respectively above and below the chamber, and configured to heat the wafer on the susceptor;
an upper pyrometer and a lower pyrometer located respectively above and below the chamber, and configured to detect respectively a temperature of the front surface of the wafer and a temperature of a back surface of the susceptor;
a source gas adjuster configured to adjust a supply time of supplying the source gas into the chamber via the gas supply port;
a dopant gas adjuster configured to adjust a flow rate of flowing the dopant gas into the chamber via the gas supply port; and
a second central processing unit (CPU) configured to perform lamp output control of controlling output values of the upper lamp and the lower lamp based on the temperature detected by the upper pyrometer or the lower pyrometer and outputting a total output value of the upper lamp and the lower lamp to the data server, and control of the source gas adjuster and the dopant gas adjuster adjustment unit,
wherein the second CPU controls the total output value of the upper lamp and the lower lamp to decrease in response to increasing thickness of a polysilicon film depositing on an inner wall of the chamber,
the thickness measurer and the resistivity measurer are configured to measure respectively a thickness and a resistivity of the epitaxial film in the epitaxial wafer produced by the single-wafer-processing epitaxial growth device, and thereafter output respectively the measured thickness and the measured resistivity to the data server,
the data server is configured to store: a preset source gas supply time and a preset dopant gas flow rate applied to the single-wafer-processing epitaxial growth device; a target thickness range and a target resistivity range as specification data; the measured thickness output from the thickness measurer and the measured resistivity output from the resistivity measurer; and the total output value of the upper lamp and the lower lamp output from the second CPU,
the first CPU is configured to correct the preset source gas supply time and the preset dopant gas flow rate to determine a corrected source gas supply time and a corrected dopant gas flow rate and output the corrected source gas supply time and the corrected dopant gas flow rate to the second CPU and the data server, based on the preset source gas supply time and the preset dopant gas flow rate, the target thickness range and the target resistivity range, the measured thickness and the measured resistivity, and the total output value of the upper lamp and the lower lamp read from the data server, and the second CPU is configured to control the source gas adjuster and the dopant gas adjuster to achieve the corrected source gas supply time and the corrected dopant gas flow rate determined by the first CPU.

2. The epitaxial wafer production system according to claim 1, wherein the first CPU is configured to, when the total output value of the upper lamp and the lower lamp read from the data server decreases, correct the preset source gas supply time to be longer to determine the corrected source gas supply time.

3. The epitaxial wafer production system according to claim 1, wherein the first CPU is configured to, in the case where the total output value of the upper lamp and the lower lamp read from the data server decreases, correct the preset dopant gas flow rate to be lower to determine the corrected dopant gas flow rate.

4. The epitaxial wafer production system according to claim 2, wherein the first CPU is configured to, in the case where the total output value of the upper lamp and the lower lamp read from the data server decreases, correct the preset dopant gas flow rate to be lower to determine the corrected dopant gas flow rate.

5. The epitaxial wafer production system according to claim 1, wherein the epitaxial wafer production system is configured to sequentially produce a plurality of epitaxial wafers.

* * * * *

UNITED STATES PATENT AND TRADEMARK OFFICE
CERTIFICATE OF CORRECTION

PATENT NO. : 11,873,577 B2
APPLICATION NO. : 17/220337
DATED : January 16, 2024
INVENTOR(S) : N. Wada It is certified that error appears in the above-identified patent and that said Letters Patent is hereby corrected as shown below:

In the Claims

Column 16, Line 35 (Claim 1, Line 38) please change "adjuster adjustment unit," to -- adjuster, --

Signed and Sealed this
Twenty-fifth Day of June, 2024

Katherine Kelly Vidal
*Director of the United States Patent and Trademark Office*

Page 1 of 1